United States Patent [19]

Takayuki

[11] 4,353,104

[45] Oct. 5, 1982

[54] OUTPUT INTERFACE CIRCUITS

[75] Inventor: Tanaka Takayuki, Tokyo, Japan

[73] Assignee: Oki Electric Industry Co., Ltd., Tokyo, Japan

[21] Appl. No.: 274,372

[22] Filed: Jun. 17, 1981

[30] Foreign Application Priority Data

Jun. 27, 1980 [JP] Japan .................................. 55-86509

[51] Int. Cl.³ ............................................. H02H 3/20
[52] U.S. Cl. ...................................... 361/91; 307/475; 361/101
[58] Field of Search ................... 361/86, 88, 100, 101, 361/91; 307/475, 264, 446, 448, 456

[56] References Cited

U.S. PATENT DOCUMENTS

| | | | |
|---|---|---|---|
| 3,796,893 | 3/1974 | Hoffman et al. | 307/475 |
| 3,835,457 | 9/1974 | Yu | 307/475 |
| 4,214,175 | 7/1980 | Chan | 307/475 X |

OTHER PUBLICATIONS

Toshio Wada et al., "A 64K×1 Bit Dynamic ED-MOS RAM", IEEE Journal of Solid-State Circuits, vol. Sc-13, No. 5, Oct. 1978, pp. 600-606.
Toshio Wada et al., "A 15-ns 1024-Bit Fully Static MOS Ram", IEEE Journal of Solid-State Circuits, vol. Sc-13, No. 5, Oct. 1978, pp. 635-639.

*Primary Examiner*—Reinhard J. Eisenzopf
*Attorney, Agent, or Firm*—Wenderoth, Lind & Ponack

[57] ABSTRACT

In an interface circuit having a plurality of MOS FETs and connected between an input terminal and an external circuit for converting a MOS logic level signal into a TTL level signal, there are provided a delay circuit, a capacitor impressed with a signal delayed by the delay circuit, a potential holding circuit, and a protective circuit for preventing damage to the MOS FETs in the potential holding circuit.

2 Claims, 6 Drawing Figures

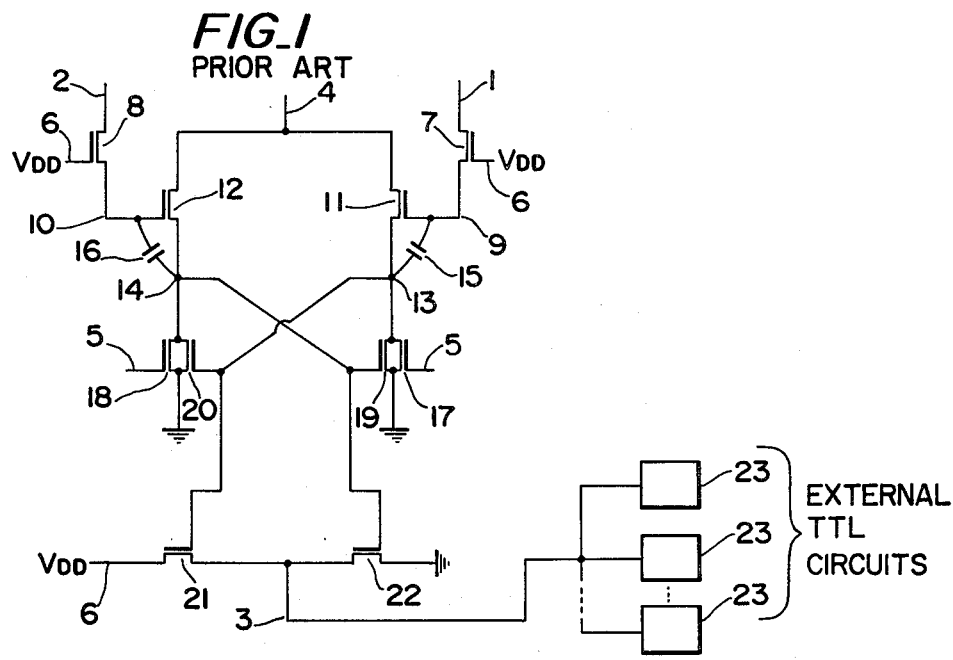
FIG_1 PRIOR ART
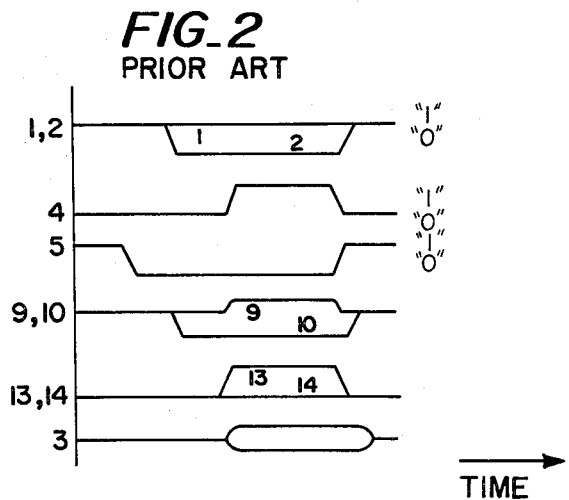
FIGURE 1 CIRCUIT TERMINALS
FIG_2 PRIOR ART

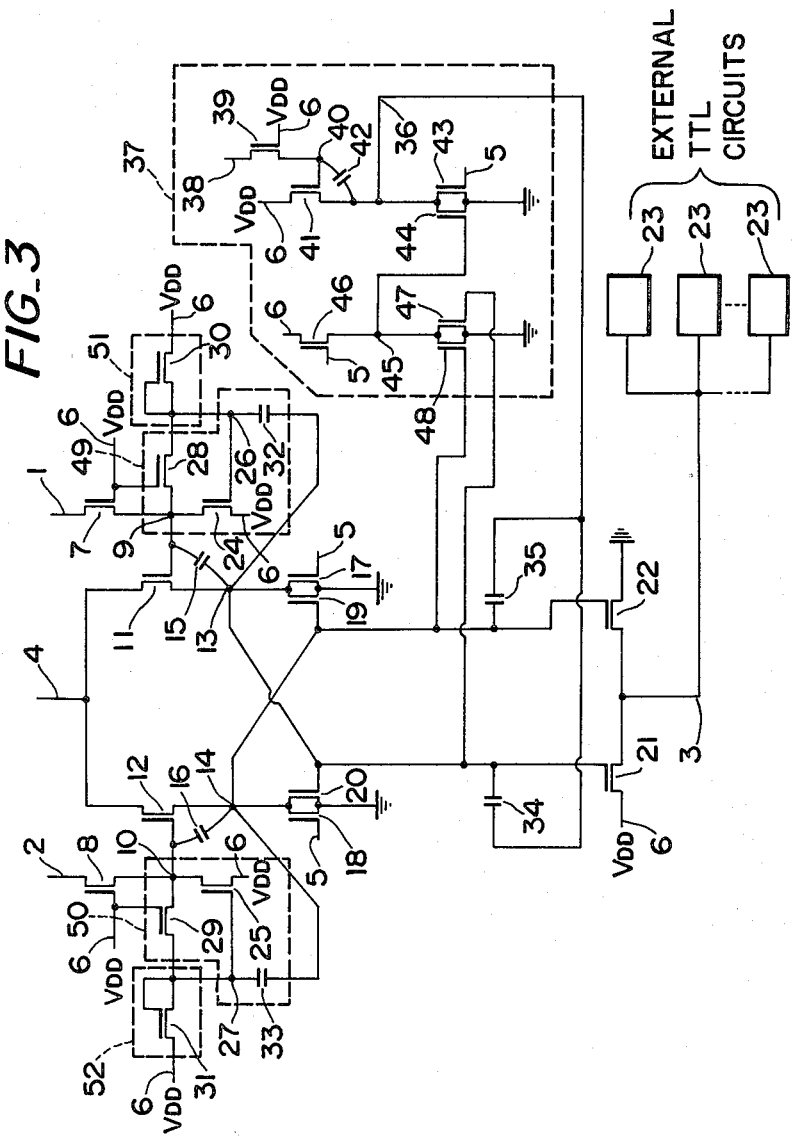

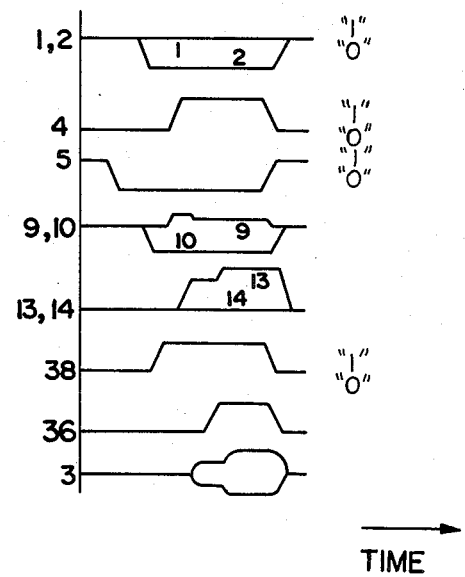

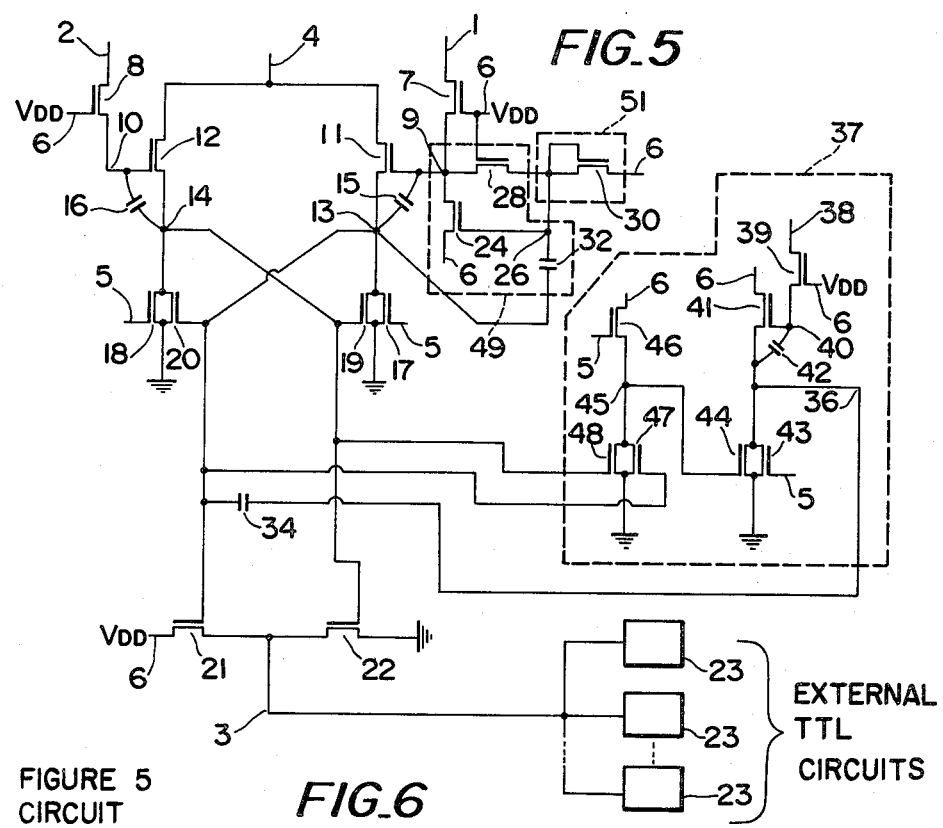
FIG. 5
FIGURE 5
CIRCUIT
TERMINALS
FIG. 6
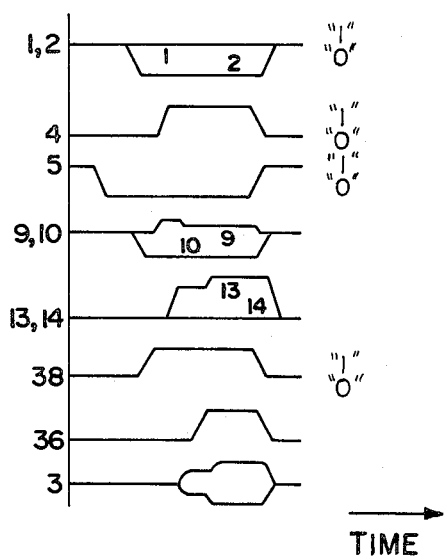

OUTPUT INTERFACE CIRCUITS

BACKGROUND OF THE INVENTION

This invention relates to an output interface circuit and, more particularly, to an output interface circuit utilized in a logic circuit constituted by an enhancement type MOS FET (metal oxide semiconductor field effect transistor).

A circuit as shown in FIG. 1 has been used as an output interface circuit for converting a MOS logic level signal into a transistor-transistor logic (TTL) level signal.

The output interface circuit shown in FIG. 1 is constructed as follows: The gate electrode of a first enhancement type MOS FET 7 (in the following explanation it should be understood that all MOS FETs are of the enhancement type) is connected to a source terminal 6, the drain electrode is connected to a MOS level signal input terminal 1 and the source electrode is connected to a terminal 9.

The gate electrode of a second MOS FET 8 is connected to the source terminal 6, the drain electrode is connected to a MOS level signal input terminal 2, and the source electrode is connected to a terminal 10.

The gate electrode of a third MOS FET 11 is connected to terminal 9 and the drain electrode is connected to an activation signal input terminal 4, while the source electrode is connected to a terminal 13. A capacitor 15 is connected between terminals 13 and 9.

The gate electrode of a fourth MOS FET 12 is connected to terminal 10 and the drain electrode is connected to the activation signal input terminal 4, while the source electrode is connected to a terminal 14. A capacitor 16 is connected between terminals 14 and 10.

The gate electrode of a fifth MOS FET 17 is connected to a reset signal input terminal 5, the drain electrode is connected to terminal 13 and the source electrode is grounded.

The gate electrode of a sixth MOS FET 18 is connected to the reset signal input terminal 5, the drain electrode is connected to the terminal 14, and the source electrode is grounded.

The gate electrode of a seventh MOS FET 19 is connected to the terminal 14, the drain electrode is connected to the terminal 13 and the source electrode is grounded.

The gate electrode of an eighth MOS FET 20 is connected to the terminal 13, the drain electrode is connected to the terminal 14 and the source electrode is grounded.

The MOS FETs 20 and 18, and the MOS FETs 17 and 19 constitute a transfer gate circuit for executing a NOR logic function.

The drain electrode of a ninth MOS FET 21 is connected to the source terminal 6 and the gate electrode is connected to the gate electrode of the eighth MOS FET 20 (i.e.-terminal 13).

The source electrode of a tenth MOS FET 22 is grounded, while the gate electrode is connected to the gate electrode of the MOS FET 19 (i.e.-terminal 14).

The drain electrode of MOS FET 22 and the source electrode of MOS FET 21 are connected to a TTL output terminal 3 having a TTL level; the output terminal 3 is connected to external TTL circuits 23 which are connected to the output interface circuit of this invention.

The operation of the circuit shown in FIG. 1 will now be described with reference to the timing chart shown in FIG. 2 in which digits 1 through 14 represent potential levels of various terminals shown in FIG. 1.

As shown in FIG. 2, high level "1" signals are inputted to the reset signal input terminal 5 and to the MOS level signal input terminals 1 and 2, while a low level "0" signal is applied to the activation signal input terminal 4.

At this time, since MOS FETs 17 and 18 become conductive, the electric charges at terminals 13 and 14 are discharged so that these terminals would assume the ground potential. Accordingly, these MOS FETs become nonconductive, whereby the TTL level output terminal 3 assumes a floating state.

Since the gate potentials of the MOS FETs 7 and 8 are equal to the potential $V_{DD}$ of the source, the potentials of the terminals 9 and 10 become equal to $V_{DD}-V_{TH}$, whereby the MOS FETs 11 and 12 become conductive where $V_{TH}$ represents the threshold value of an enhancement type MOS FET.

Then, the signal of the reset signal input terminal 5 becomes a low level and when the MOS level signal input terminal 2 switches to a low level, the MOS FETs 17 and 18 become nonconductive while the charge on the terminal 10 discharges to assume the ground potential, thus rendering MOS FET 12 nonconductive. At this time, the potential of the terminal 9 is maintained at $V_{DD}-V_{TH}$.

Then, when a high level signal is applied to the activating signal input terminal 4, the MOS FET 11 becomes conductive, while the terminal 13 is charged to the potential $V_{DD}$ by the bootstrap effect of the capacitor 15.

At this time, the MOS FET 21 is conductive and the MOS FET 22 is nonconductive and the potential of the TTL level output terminal 3 becomes equal to $V_{DD}-V_{TH}$.

Consequently, when a high level logic signal at the MOS level is applied to the MOS level signal input terminal 1, a high level logic signal at a TTL level would appear on the TTL level output terminal 3.

In the same manner, when a low level signal is applied to the MOS level signal input terminal 1 and a high level signal is applied to the MOS level signal input terminal 2, a low level logic signal at a TTL level appears on the TTL logic level output terminal 3.

The prior art output interface circuit shown in FIG. 1 has the following defects when an external TTL circuit 23 judges the logic state of the TTL logic level output terminal 3.

More particularly, where the logic state of the TTL logic level output terminal 3 is at a high level, its potential is $V_{DD}-V_{TH}$ so that when the source voltage $V_{DD}$ is lowered, the external TTL circuit 23 cannot correctly judge the logic high level. Assuming that, for example, $V_{DD}=4$ V and $V_{TH}=1$ V, the potential of the TTL level output terminal 3 is 3 V. Since the minimum potential of an ordinary logic high level "1" is 2.4 V, the voltage margin of the logic high level is only 0.6 V.

When a number of external TTL circuits 23 are connected to the TTL level output terminal 3 for the purpose of increasing the fan-out, the current supplied to the external TTL circuits 23 from the TTL level output terminal 3 increases, thereby lowering the potential of the output terminal 3 which makes it difficult to judge the logic high level.

When the TTL level output terminal 3 becomes a logic low level under a state in which the number of fanouts has been increased, the current supplied from the external TTL circuit 23 to the TTL level output terminal 3 increases the potential of the TTL level output terminal 3 so that the judgement of the logic low level "0" becomes difficult.

When the current capacities of the MOS FETs 21 and 22 are increased for the purpose of obviating these difficulties, the area coupled by these MOS FETs increases, thus decreasing the density of a semiconductor integrated circuit device.

SUMMARY OF THE INVENTION

It is an object of this invention to provide a novel output interface circuit having an excellent TTL output fan-out characteristic.

Another object of this invention is to provide an improved output interface circuit capable of normally operating with a low source voltage.

Briefly stated, the instant invention is characterized in that a delay circuit, a capacitor supplied with a signal delayed by the delay circuit, a potential level holding circuit and a protective circuit for preventing damage to the MOS FETs are provided for the output interface circuit.

According to this invention there is provided an output interface circuit comprising a first MOS FET having a source electrode, a drain electrode connected to a first MOS level signal input terminal, and a gate electrode connected to a first source of fixed voltage; a second MOS FET having a source electrode, a drain elctrode connected to a second MOS level signal input terminal; and a gate electrode connected to the first source of fixed voltage; a third MOS FET having a source electrode connected to a first output terminal, a gate electrode connected to the source electrode of the first MOS FET, and a drain electrode connected to a first start signal input terminal; a fourth MOS FET having a source electrode connected to a second output terminal, a gate electrode connected to the source electrode of the second MOS FET, and a drain electrode connected to the first start signal input terminal; a first capacitor connected between the gate and source electrodes of the third MOS FET; a second capacitor connected between the gate and source electrodes of the fourth MOS FET; a first transfer gate circuit adapted to execute a NOR gate logic of a reset signal and a signal at the second output terminal, and having an output terminal connected to the first output terminal; a second transfer gate circuit executing a NOR gate logic of the reset signal and the signal at the first output terminal, and having an output terminal connected to the second output terminal; an output circuit for selectively converting signals at the first and second output terminals into a TTL level output signal; a delay circuit supplied with the signals at the first and second output terminals for outputting a digital signal corresponding to a logic "1" of the output signal in accordance with a second start signal inputted earlier than the first start signal; a third capacitor connected between an output terminal of the delay circuit and the second output terminal; a level holding circuit constituted by a capacitor and MOS FETs for compensating for a decrease in a gate potential of the fourth MOS FET, the circuit being connected across the second capacitor to render the same nonconductive; and a protective circuit for preventing damage to the MOS FETs in the level holding circuit.

BRIEF DESCRIPTION OF THE DRAWINGS

In the accompanying drawings:

FIG. 1 is a connection diagram showing a prior art output interface circuit;

FIG. 2 is a timing chart useful to explain the operation of the output interface circuit shown in FIG. 1;

FIG. 3 is a connection diagram showing a first embodiment of the output interface circuit according to this invention;

FIG. 4 is a timing chart useful to explain the operation of the output interface circuit shown in FIG. 3;

FIG. 5 is a connection diagram showing a second embodiment of the output interface circuit according to this invention; and FIG. 6 is a timing chart useful to explain the operation of the output interface circuit shown in FIG. 5.

DESCRIPTION OF THE PREFERRED EMBODIMENTS

The detail of the first embodiment of this invention will now be described with reference to FIGS. 3 and 4.

In the circuit shown in FIG. 3, MOS FETs 7, 8, 11, 12, 17, 18, 19, 20, 21 and 22, capacitors 15 and 16 and the external TTL circuit 23 are identical to those shown in FIG. 1. The gate electrode of a MOS FET 24 is connected to a terminal 26 and the source electrode is connected to the source terminal 6. The gate electrode of a MOS FET 28 is connected to the source terminal 6, the drain electrode is connected to the terminal 9 and the source electrode is connected to a terminal 26. A capacitor 32 is connected between terminals 13 and 26. These circuit elements constitute a level holding circuit 49 which sets the potentials of the terminals 9 and 13.

A MOS FET 30 with its gate and drain electrodes commonly connected to the terminal 26 and the source electrode coupled to the source terminal 6 forms a protective circuit 51 which prevents damage to the MOS FETS 24 and 28.

The gate electrode of a MOS FET 25 is connected to a terminal 27, the drain electrode is connected to the terminal 10, and the source electrode is connected to the source terminal 6. The gate electrode of a MOS FET 29 is connected to the source terminal 6, the drain electrode is connected to the terminal 10 and the source electrode is connected to the terminal 27. A capacitor 33 is connected between terminals 14 and 27. These circuit elements constitute a level holding circuit 50 which sets the potentials of the terminals 10 and 14.

A MOS FET 31 with its gate and drain electrodes commonly connected to the terminal 27 and the source electrode connected to the source terminal 6 forms a protective circuit 52 that prevents damage to the MOS FETs 25 and 29.

The gate electrode of a MOS FET 39 is connected to the source terminal 6, the drain electrode is connected to a terminal 38 and the source electrode is connected to a terminal 40. The gate electrode of a MOS FET 41 is connected to the terminal 40, the drain electrode is connected to the source terminal 6 and the source electrode is connected to a terminal 36. A capacitor 42 is connected between terminals 36 and 40. The gate electrode of a MOS FET 43 is connected to the reset signal input terminal 5, the drain electrode (i.e. terminal 36) is connected to the terminals 13 and 14 respectively through capacitors 34 and 35, and the source terminal is connected to ground. Denoting the parasitic capacitances of the terminals 13 and 14 by $C_1$, the capacitances of the capacitors 34 and 35 are set to be higher than $V_{TH}\cdot C_1/(V_{DD}-V_{TH})$. The gate electrode of a MOS FET 44 is connected to a terminal 45, the drain electrode is connected to the terminal 36 and the source electrode is grounded. The gate electrode of a MOS FET 46 is connected to the reset signal input terminal 5, the drain electrode is connected to the source terminal 6, and the source electrode is connected to the terminal 45 to which are connected the drain electrodes of MOS FETs 47 and 48. The source electrodes of MOS FETs 47 and 48 are connected to ground and their gate electrodes are respectively connected to terminals 13 and 14. The MOS FETs 39, 41, 43, 44 and 46-48, and capacitor 42 constitute a delay circuit 37 which gradually increases the potential of terminals 13 or 14.

The operation of the output interface circuit shown in FIG. 3 will now be described with reference to the timing chart shown in FIG. 4 in which the numbers show potential levels of various terminals shown in FIG. 3.

As shown in FIG. 4, when a high level input signal is applied to the reset signal input terminal 5 and the MOS level signal input terminals 1 and 2, and when a low level signal is applied to the activation signal input terminals 4 and 38, as has been described in connection with the output interface circuit shown in FIG. 1, the terminals 9 and 10 are charged up to a potential of $V_{DD}-V_{TH}$ and terminals 13 and 14 assume a ground potential so that the TTL level output terminal 3 is in a floating state.

When the reset signal input terminal 5 is switched to a low level, the MOS FETs 17, 18, 43 and 46 are rendered nonconductive, whereby the terminal 36 assumes a ground potential.

When the MOS level signal input terminal 2 becomes a low level and the terminal 38 becomes a high level, then terminal 10 is changed to a ground potential.

When the activation signal input terminal 4 becomes a high level, the potential of the terminal 9 rises to $V_{DD}+V_{TH}$ due to the bootstrap effect of the capacitor 15, and maintains this value, while the potential of the terminal 13 becomes equal to the source potential $V_{DD}$.

A predetermined time thereafter, the potential of the terminal 36 becomes equal to $V_{DD}$ divided by the capacitor 34 and the parasitic capacitance $C_1$ of the terminal 13 and superposed upon the potential $V_{DD}$ of the terminal 13 so that the potential of terminal 36 rises from $V_{DD}$ to a value which is more than $V_{DD}+V_{TH}$.

Similarly, when the activation signal input terminal 4 is at a high level, the MOS level signal input terminal 2 is at a high level and when the MOS level signal input terminal 1 is as a low level the MOS FET 21 becomes nonconductive, while the MOS FET 22 becomes conductive. At this time, since a potential higher than $V_{DD}+V_{TH}$ is impressed upon the gate electrode of the MOS FET 22, it becomes fully conductive so that a lower logic output very close to a ground potential would appear at the TTL level output terminal 3.

The level holding circuit 49 operates as follows:
When it is assumed that the MOS level signal input terminals 1 and 2 and the reset signal input terminal 5 are at a high level, the terminal 45 becomes a high level, while the TTL level output terminal 36 reaches a ground potential.

Then, when the reset signal input terminal 5 becomes a low level, when either one of the MOS level signal input terminals 1 and 2 becomes a low level and when the terminal 38 is switched to a high level, both MOS FETs 43 and 44 become nonconductive so that the terminal 36 would be charged to the source potential $V_{DD}$ due to the bootstrap effect of the capacitor 42.

In the level holding circuit 49, the capacitor 32 is set to have a capacitance larger than $2 V_{TH}\cdot C_2/(V_{DD}-2 V_{TH})$, where $C_2$ represents the parasitic capacitance of the terminal 26.

When a high level signal is applied to the MOS level signal input terminal 1 and the activation signal input terminal 4, a bootstrap circuit made up of the MOS FETs 7 and 11 and the capacitor 15 charges the terminal 13 to the source potential $V_{DD}$, and charges the terminal 26 to a voltage of $V_{DD}-V_{TH}$, but since a potential divided by the capacitors 32 and $C_2$ is superposed, the potential of the terminal 26 becomes higher than $V_{DD}+V_{TH}$.

At the same time, MOS FET 24 becomes conductive to decrease the potential of the terminal 9 to the source potential $V_{DD}$ so that the MOS FET 11 is rendered nonconductive to disconnect terminal 4 from terminal 13 so as to prevent the potential of the terminal 13 from decreasing.

In the protective circuit 51, as the potential of the terminal 26 rises above $V_{DD}+V_{TH}$, the MOS FET 30 limits the potential of the terminal 26 to $V_{DD}+V_{TH}$ thereby preventing damage to the gate electrode of the MOS FET 24.

As described above, the output interface circuit according to this invention operates such that when the TTL level output logic is at a high level, the MOS FET 21 becomes sufficiently conductive to output the source potential $V_{DD}$, and when the output logic is at a low level, the MOS FET 22 becomes sufficiently conductive to output a perfect ground potential with the result that even when the source potential $V_{DD}$ is decreased, the external TTL circuit 23 can correctly judge the output logic.

In the prior art output interface circuit, when the TTL level output terminal 3 is at the high level, the output current $I_{OH}$ that can be derived as an output from the TTL level output terminal 3 is given by the following Sah equation:

$$I_{OH} \geqq \beta/2\cdot(V_{DD}-V_{OH}-V_{TH})^2$$

where $\beta$ represents a constant of a MOS FET, and $V_{OH}$ represents a high level output of the TTL circuit. On the other hand, according to this invention, the output current $I_{OH}$ of the output interface embodying the invention is given by:

$$I_{OH} \geqq \beta/2\cdot(V_{DD}-V_{OH})^2$$

On the other hand, in the prior art output interface circuit when the TTL level output terminal 3 is at low level L, the current $I_{OL}$ that can be supplied from the TTL level output terminal 3 to the external TTL circuit 23 is given by the following Sah equation:

$$I_{OL} = \beta\{(V_{DD}-V_{TH})V_{OL} - \tfrac{1}{2}V_{OL}^2\}$$

However, with an output interface circuit embodying the present invention, the current $I_{OL}$ that can be supplied to the output interface circuit is given by:

$$I_{OL} \geqq \beta\{(V_{DD}\cdot V_{OL} - \tfrac{1}{2}V_{OL}^2)\}$$

For this reason, with a circuit in accordance with the present invention, since no loss is caused by the threshold voltage $V_{TH}$ and since the input and output current capacities are large, it is possible to increase the number of fan-outs.

Moreover, with a circuit in accordance with the present invention, since the terminals 13 and 14 are charged to a potential which is higher than $V_{DD}+V_{TH}$, the gm (mutual conductance) of the MOS FETs 21 and 22 becomes large, thus improving the response speed of the TTL level output signal with respect to the MOS level input signal.

FIG. 5 shows a second embodiment of the output interface circuit of this invention, and FIG. 6 shows the timing chart for explaining the operation of this modification. Digits in FIG. 6 show the potential levels of various terminals of the circuit shown in FIG. 5.

The output interface circuit shown in FIG. 5 is different from that shown in FIG. 3 in that the level holding circuit 50, the protective circuit 52 and the capacitor 35 on the side of the MOS level signal input terminal 2 are eliminated.

For this reason, the potential of the terminal 14 does not increase to a potential higher than $V_{DD}+V_{TH}$ from the source potential but in this case, since the width of the gate electrode of the MOS FET 22 is increased for purpose at increasing the current capacity, at the low output logic of the TTL level, a potential substantially equal to the ground potential can be obtained at the TTL level output terminal 3. Other circuit operations are substantially the same as those of the first embodiment.

In addition to the advantage of high output logic of the first embodiment, the second embodiment has an additional advantage in that the number of circuit elements can be reduced.

As above described, in the output interface circuit embodying the invention, since the source voltage variation margin is large, the output interface circuit can operate stably with a single source of low voltage, for example 5 volts, so that when a TTL output interface circuit according to this invention, fabricated of enhancement type MOS FETs, is incorporated into a MOS LSI, a significant advantage over prior art systems can be obtained.

What is claimed is:

1. An output interface circuit comprising:
   a first MOS FET having a source electrode, a drain electrode connected to a first MOS level signal input terminal, and a gate electrode connected to a first source of fixed voltage;
   a second MOS FET having a source electrode, a drain electrode connected to a second MOS level signal input terminal, and a gate electrode connected to said first source of fixed voltage;
   a third MOS FET having a source electrode connected to a first output terminal, a gate electrode connected to the source electrode of said first MOS FET, and a drain electrode connected to a first start signal input terminal;
   a fourth MOS FET having a source electrode connected to a second output terminal, a gate electrode connected to the source electrode of said second MOS FET, and a drain electrode connected to said first start signal input terminal;
   a first capacitor connected between the gate and source electrodes of said third MOS FET;
   a second capacitor connected between the gate and source electrodes of said fourth MOS FET;
   a first transfer gate circuit for executing a NOR logic function of a reset signal and a signal at said second output terminal, and having an output terminal connected to said first output terminal;
   a second transfer gate circuit for executing a NOR logic function of said reset signal and the signal at said first output terminal and having an output terminal connected to said second output terminal;
   an output circuit for selectively converting signals at said first and second output terminals into a TTL level output signal;
   a delay circuit supplied with said signals at said first and second output terminals for outputting a delayed signal corresponding to a logic "1" of said output signal of said output circuit in accordance with a second start signal inputted thereto earlier than said first start signal;
   a third capacitor connected between an output terminal of said delay circuit and said second output terminal;
   a level holding circuit comprising a capacitor and a pair of MOS FETs for compensating for a decrease in a gate potential of said fourth MOS FET, said level holding circuit being connected across said second capacitor so as to render said fourth MOS FET nonconductive; and
   a protective circuit means, operatively connected to said pair of MOS FETs in said level holding circuit for preventing damage to said MOS FETs in said level holding circuit by limiting the voltage levels thereof.

2. An output interface circuit comprising:
   a first MOS FET having a source electrode, a drain electrode connected to a first MOS level signal input terminal, and a gate electrode connected to a first source of fixed voltage;
   a second MOS FET having a source electrode, a drain electrode connected to a second MOS Level signal input terminal, and a gate electrode connected to said first source of fixed voltage;
   a third MOS FET having a source electrode connected to a first output terminal, a gate electrode connected to the source electrode of said first MOS FET, and a drain electrode connected to a first start signal input terminal;
   a fourth MOS FET having a source electrode connected to a second output terminal, a gate electrode connected to the source electrode of said second MOS FET, and a drain electrode connected to said first start signal input terminal;
   a first capacitor connected between the gate and source electrodes of said third MOS FET;
   a second capacitor connected between the gate and source electrodes of said fourth MOS FET;
   a first transfer gate circuit for executing a NOR logic function of a reset signal and a signal at said second output terminal, and having an output terminal connected to said first output terminal;
   a second transfer gate circuit for executing a NOR logic function of said reset signal and the signal at said first output terminal and having an output terminal connected to said second output terminal;
   an output circuit for selectively converting signals at said first and second output terminals into a TTL level output signal;

a delay circuit supplied with said signals at said first and second output terminals for outputting a delayed signal corresponding to a logic "1" of said output signal of said output circuit in accordance with a second start signal inputted thereto earlier than said first start signal;

third and fourth feedback capacitors connected between an output terminal of said delay circuit and said first and second output terminals respectively;

a first level holding circuit comprising a capacitor and a pair of MOS FETs for compensating for a decrease in a gate potential of said third MOS FET, said first level holding circuit being connected across said first capacitor so as to render said third MOS FET nonconductive;

a first protective circuit means, operatively connected to said pair of MOS FETs in said first level holding circuit for preventing damage to said pair of MOS FETs in said first level holding circuit by limiting the voltage levels thereof;

a second level holding circuit comprising another capacitor and another pair of MOS FETs for compensating for a decrease in a gate potential of said fourth MOS FET, said second level holding circuit being connected across said second capacitor so as to render said fourth MOS FET nonconductive; and a second protective circuit means, operatively connected to said another pair of MOS FETs in said second level holding circuit for preventing damage to said another pair of MOS FETs in said second level holding circuit by limiting the voltage levels thereof.

* * * * *